United States Patent [19]
Satani et al.

[11] Patent Number: 5,859,793
[45] Date of Patent: Jan. 12, 1999

[54] SYNCHRONOUS SEMICONDUCTOR MEMORY DEVICE

[75] Inventors: Norihiko Satani; Tetsuya Mitoma, both of Miyazaki, Japan

[73] Assignee: Oki Electric Industry, Co., Ltd., Tokyo, Japan

[21] Appl. No.: 825,463

[22] Filed: Mar. 28, 1997

[30] Foreign Application Priority Data

Mar. 29, 1996 [JP] Japan .................................. 8-076234

[51] Int. Cl.$^6$ .................................................. G11C 5/06
[52] U.S. Cl. .............................. 365/63; 365/51; 365/149
[58] Field of Search .................................. 365/63, 51, 149

[56] References Cited

U.S. PATENT DOCUMENTS

| | | | |
|---|---|---|---|
| 4,751,680 | 6/1988 | Wang et al. .............................. | 365/203 |
| 4,984,197 | 1/1991 | Sakagami .................................. | 365/63 |
| 5,276,649 | 1/1994 | Hoshita et al. .......................... | 365/206 |
| 5,367,492 | 11/1994 | Kawamoto et al. ...................... | 365/63 |
| 5,487,043 | 1/1996 | Furutani et al. .......................... | 365/203 |
| 5,615,156 | 3/1997 | Yoshida et al. ............................ | 365/63 |
| 5,684,736 | 11/1997 | Chan ........................................ | 365/149 |

FOREIGN PATENT DOCUMENTS 0167281  8/1986  European Pat. Off. ................. 365/63

*Primary Examiner*—Son T. Dinh
*Attorney, Agent, or Firm*—Rabin & Champagne, P.C.

[57] ABSTRACT

A synchronous semiconductor memory device which prevents to misread due to the parasitic capacitance is disclosed. A synchronous semiconductor memory device of the present invention comprises memory cells for storing data therein, sense amplifiers coupled to the memory cells and pairs of data lines coupled to the sense amplifiers. The data lines extend to one direction so that the data lines are substantially parallel to each other. The pairs of data lines include first pairs of data lines and second pairs of data lines located between the first pairs of data lines. Each of the second pairs has a cross point at which each of the data lines of the pair crosses each other.

24 Claims, 6 Drawing Sheets

5,859,793

SYNCHRONOUS SEMICONDUCTOR MEMORY DEVICE

BACKGROUND OF THE INVENTION

1. Field of the Invention

This invention relates to a semiconductor memory device, and specifically to a layout suitable for a synchronous DRAM (Dynamic Random Access Memory).

2. Description of the Related Art

A great feature of a synchronous DRAM is that it follows the architecture of other general-purpose DRAM and is activated at a high frequency of 100 MHz or above using a low-voltage TTL interface. Further, the synchronous DRAM is of a clock synchronous type and allows a pipeline operation by which burst data can be transferred even during a cycle in which an address is inputted and decoded. In order to perform these advantageous functions, one obtained by frequency-dividing a clock into ½, for example, is used inside the synchronous DRAM. Thus, the internal operation of the synchronous DRAM is synchronized with ½ of the frequency of an external clock, regardless of external-clock input conditions. Therefore, the synchronous DRAM is excellent in operating margin.

The synchronous DRAM alternately reads information from and writes it into adjacent data line pairs in synchronism with a clock signal. The data line pair at the time of its read operation has been precharged to VCC-VT (where VCC is the power source potential, and Vt is the threshold voltage of a transistor connected between each data line and a power source potential supply source) in advance. A small potential difference $\Delta V$ appears between the adjacent data line pairs from the subsequent reading of data. In the write operation, one of the data line pair is supplied with VCC, whereas the other is supplied with VSS.

When the write operation is performed prior to the read operation in the synchronous DRAM, one of the data line pair is precharged from VSS to VCC-Vt, whereas the other is precharged from VCC to VCC-Vt. Since a parasitic capacitance exists at this time between one of the precharged data line pair and one of the data line pair adjacent thereto, the initial potential of the corresponding data line is increased to VCC-Vt+$\alpha$. The term $\alpha$ reflects the degree of coupling that results from the parasitic capacitance. With such a device, there has been the possibility that even if information is thereafter read from a sense amplifier, the difference in potential $\Delta V$ between the adjacent data line pairs has not become wide, so that data would be outputted erroneously.

SUMMARY OF THE INVENTION

With the foregoing in view, it is an object of the present invention to provide a synchronous semiconductor memory device which prevents misreading due to the parasitic capacitance.

A synchronous semiconductor memory device of the present invention comprises memory cells for storing data therein, sense amplifiers coupled to the memory cells and pairs of data lines coupled to the sense amplifiers. The data lines extend to one direction so that the data lines are substantially parallel to each other. The pairs of data lines include first pairs of data lines and second pairs of data lines located between the first pairs of data lines. Each second pair has a cross point at which they cross each other.

A typical example of the present application has been shown in brief. However, the various inventions of the present application and specific configurations thereby will be understood from the following description.

BRIEF DESCRIPTION OF THE DRAWINGS

While the specification concludes with claims particularly pointing out and distinctly claiming the subject matter which is regarded as the invention, it is believed that the invention, and the objects, features and advantages thereof will be better understood from the following description taken with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
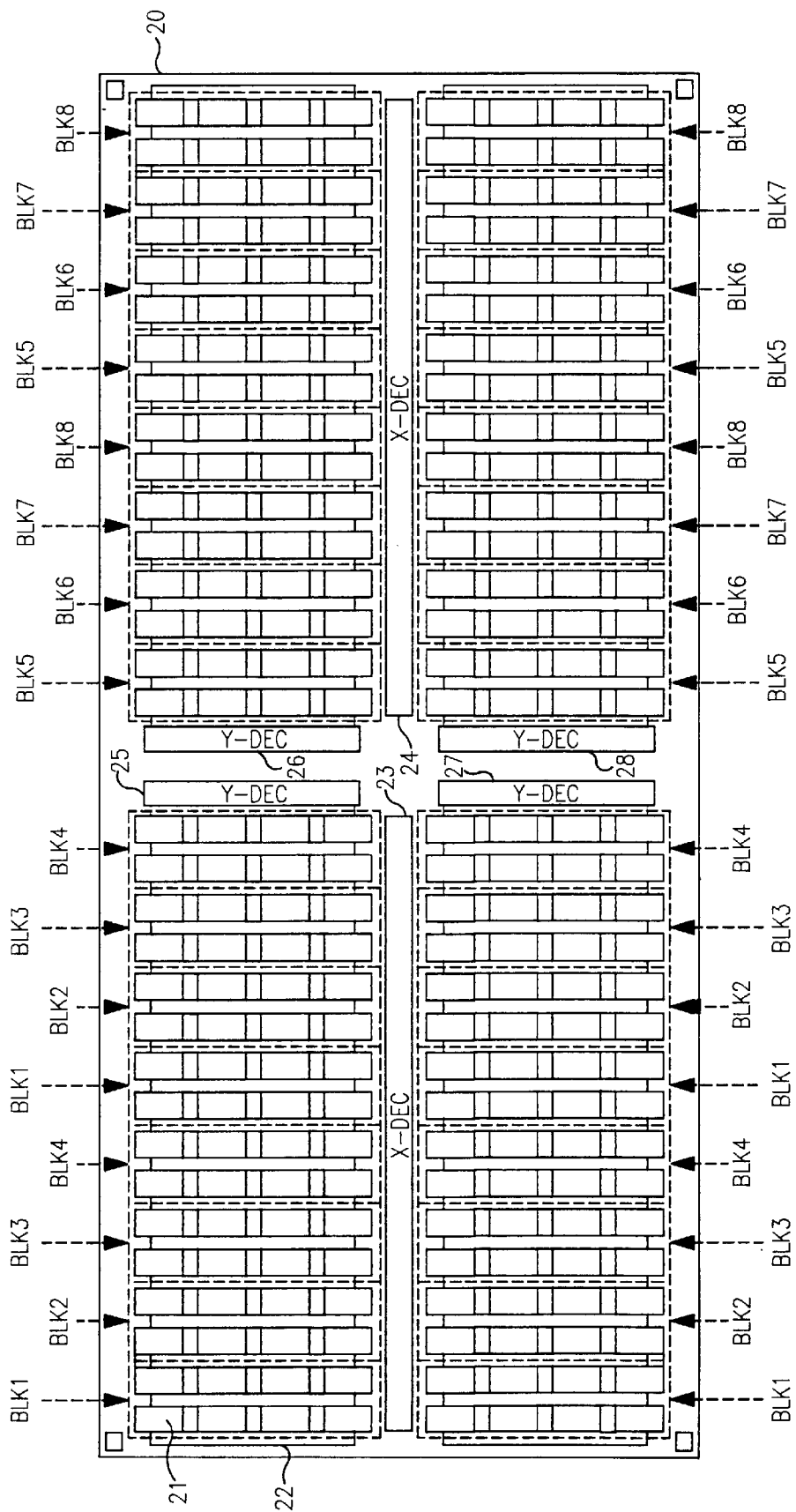
FIG. 1 is a diagram showing the layout of a synchronous DRAM according to a first embodiment of the present invention.

FIG. 1 is a diagram showing the layout of a synchronous DRAM according to a first embodiment of the present invention.

A synchronous DRAM 20 has a number of memory cell portions 21. Sense amplifier rows 22 are respectively provided between rows of the memory cell portions 21. In the synchronous DRAM 20, two X decoder portions 23 and 24, four Y decoder portions 25, 26, 27 and 28, and addresses to be supplied thereto are used. Further, a plurality of the memory cell portions 21 are used in a state of having been divided into eight blocks BLK1 through BLK8.

Figure 2:
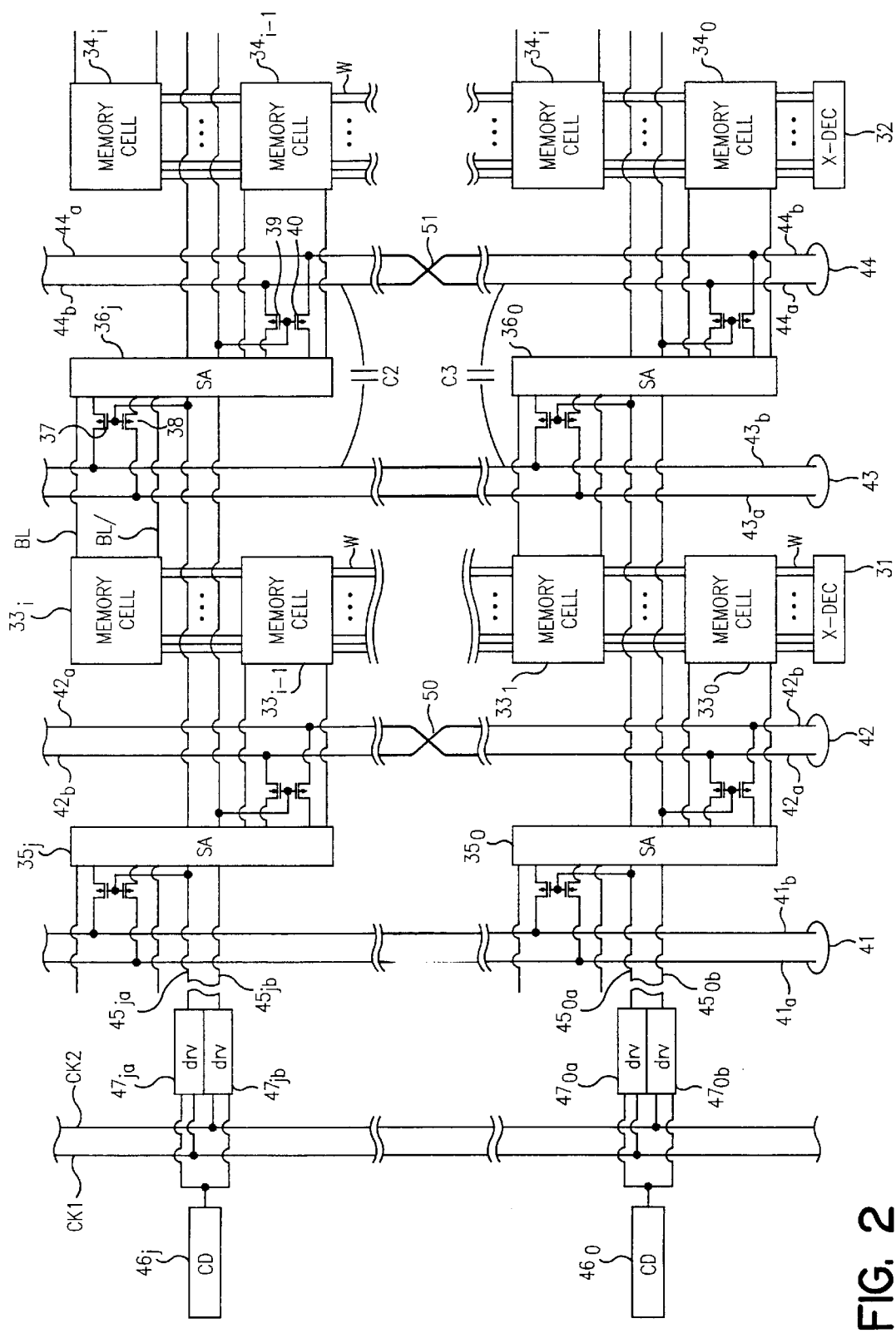
FIG. 2 is a circuit diagram of the synchronous DRAM shown in FIG. 1.

FIG. 2 is a circuit diagram of the synchronous DRAM shown in FIG. 1 and illustrates details on the synchronous DRAM shown in FIG. 1.

In FIG. 2, two X decoders (X-DEC) 31 and 32 are shown. These X decoders 31 and 32 constitute a part of the X decoder portion 23 shown in FIG. 1, for example. A plurality of word lines W are respectively electrically connected to the outputs of the X decoders 31 and 32. A plurality of memory cell portions $33_0$ through $33_i$ (i: integer) are respectively electrically cascade-connected to groups of the word lines W electrically connected to the output of the X decoder 31. Similarly, a plurality of memory cell portions $34_0$ through $34_i$ (i: positive integer) are respectively electrically connected to groups of the word lines W electrically connected to the output of the X decoder 32. The individual memory cell portions $33_0$ through $33_i$ and $34_0$ through $34_i$ respectively have a plurality of memory cells and constitute a memory cell array in all of these. The plurality of memory cells included in each of the memory cell portions $33_0$ through $33_i$ and $34_0$ through $34_i$ are electrically connected to any one of a plurality of sense amplifiers $35_0$ through $35_j$ (j: positive integer) and $36_0$ through $36_j$ via two bit lines BL and BL/. For example, the memory cell portion $33_0$, the memory cell portion $33_i$, the memory cell portion $33_{i-1}$, and the memory cell portions $33_i$ are respectively electrically connected to the sense amplifier $35_0$, the sense amplifier $36_0$, the sense amplifier $35_j$ and the sense amplifier $36j$. Incidentally, the memory cell portions $34_0$ through $34_i$ are also respectively electrically connected to unillustrated sense amplifiers.

Four NMOSs 37, 38, 39 and 40 corresponding to connecting means are electrically connected to each of the sense amplifiers $35_0$ through $35_j$ and $36_0$ through $36j$. The sense amplifiers $35_0$ through $35_j$ and $36_0$ through $36j$ are respectively selected by the turning on and off of these NMOSs 37 through 40. Thus, the sense amplifiers $35_0$ through $35_j$ and $36_0$ through $36j$ are respectively electrically connected to ODD data line pairs 41 and 43 through the NMOSs 37 and 38 or respectively electrically connected to EVEN data line pairs 42 and 44 different from the ODD data line pairs 41 and 43 through the NMOSs 39 and 40. Namely, the sense amplifiers $35_0$ through $35_j$ are respectively electrically connected to the ODD data line pair 41 or the EVEN data line pair 42, whereas the sense amplifiers $36_0$ through $36j$ are respectively electrically connected to the ODD data line pair 43 or the EVEN data line pair 44. The ODD data line pair 41 consists of two data lines 41a and 41b, whereas the ODD data line pair 43 is composed of two data lines 43a and 43b. Further, the EVEN data line pair 42 comprises two data lines 42a and 42b, whereas the EVEN data line pair 44 consists of two data lines 44a and 44b.

Control on the selection and connection of the sense amplifiers is done based on signals (driven conditions) on ODD column lines $45_{0a}$ through $45_{ja}$ respectively electrically connected to the gates of the NMOSs 37 and 38 and EVEN column lines $45_{0b}$ through $45_{jb}$ respectively electrically connected to the gates of the NMOSs 39 and 40.

The synchronous DRAM shown in FIG. 2 is provided with column decoders $46_0$ through $46_j$. The column decoders $46_0$ through $46_j$ are respectively activated in synchronism with an internal clock Ci identical in frequency to an external clock Co and respectively decode addresses supplied thereto so as to select memory cells from the memory cell array. Two sets of drivers $47_{0a}$ and $47_{0b}$ through $47_{ja}$ and $47_{jb}$, which serve as driver means, are respectively electrically connected to the outputs of the column decoders $46_0$ through $46_j$. The drivers $47_{0a}$ through $47_{ja}$ Of these drivers are respectively supplied with a clock CK1 obtained by dividing the frequency of the external clock Co into ½, whereas the drivers $47_{0b}$ through $47_{jb}$ thereof are respectively supplied with a clock CK2 identical in frequency to the clock CK1. However, the two clocks CK1 and CK2 are out of phase with each other by a half period. The outputs of the drivers $47_{0a}$ through $47_{ja}$ are respectively electrically connected to the ODD column lines $45_{0a}$ through $45_{ja}$, whereas the outputs of the drivers $47_{0b}$ through $47_{jb}$ are respectively electrically connected to the EVEN column lines $45_{0b}$ through $45_{jb}$.

In the synchronous DRAM according to the present embodiment, cross points 50 and 51 are respectively provided at intermediate portions of the EVEN data line pairs 42 and 44. Namely, the changing of positions between the data lines 42a and 42b is made at the cross point 50. Similarly, the changing of positions between the data lines 44a and 44b is made at the cross point 51. The data line pairs each having the cross point and the data line pairs each having no cross point are arranged in an alternating sequence.

Figure 3:
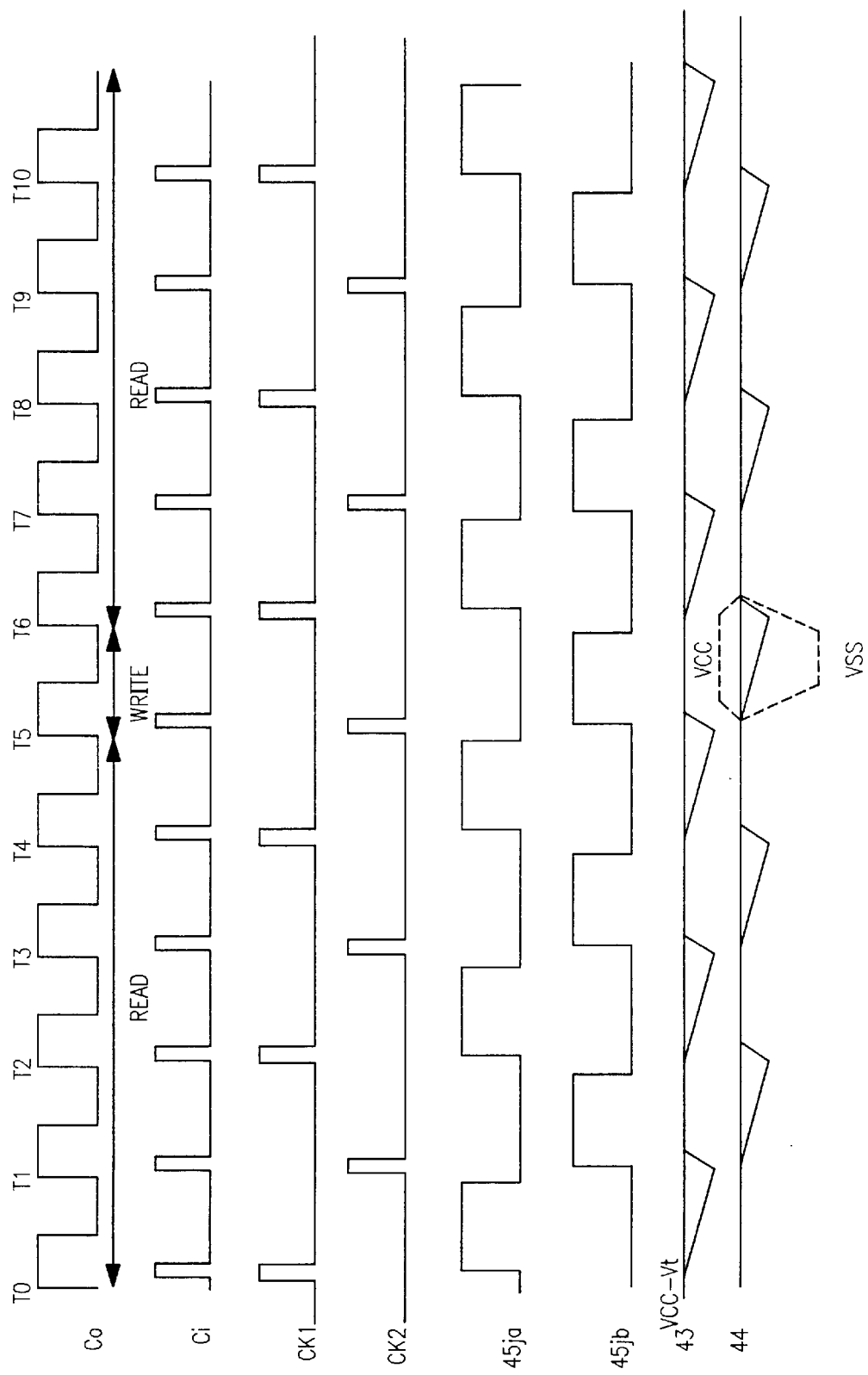
FIG. 3 is a waveform chart for illustrating the operation of the synchronous DRAM shown in FIG. 2.

FIG. 3 is a waveform chart for describing the operation of the synchronous DRAM shown in FIG. 2. The operation of the synchronous DRAM shown in FIG. 1 will be described with reference to FIG. 3.

For example, when it is desired to write information into a memory cell in the memory cell portion $33_i$ (during a period T5 to T6 in FIG. 3), a block selecting process is performed based on a given address to select the block BLK1. Further, the X decoder 31 selects a word line W corresponding to the address from the plurality of word lines W and activates it. Thus, a memory cell row is selected in response to the activation of the word line W. On the other hand, the column decoder $46_j$ is selected based on the address. The column decoder $46_j$ makes a select signal effective and supplies it to the drivers $47_{ja}$ and $47_{jb}$. When the driver $47_{ja}$ is controlled by the clock pulse CK1 so as to activate the ODD column line $45_{ja}$, the NMOSs 37 and 38 provided in association with the sense amplifier $36j$ are turned on so that input data on the ODD data line pair 43 is received by the sense amplifier $36j$. The data received by the sense amplifier $36j$ is written into the corresponding memory cell in the memory cell portion $33_i$, which has been selected by the word line W, through the bit lines BL and BL/.

A read operation of the synchronous DRAM will next be described. When the synchronous DRAM performs a reading process, the respective data lines 41a and 41b through 44a and 44b are normally respectively precharged to a potential of VCC-Vt. With the data lines in this condition, a block selecting process is performed based on a given address to select the block BLK1. Further, the X decoder 31 selects a word line W corresponding to the address from the plurality of word lines W, and activates it. A memory cell row is selected in response to the activation of the word line W. As a result, memory cells in the plurality of memory cell portions $33_0$ through $33_i$ are selected, and data are read from the selected memory cells to the corresponding sense amplifiers $36_0$ through $36j$ through the bit lines BL and BL/.

On the other hand, the column decoder $46_j$ is selected based on the address. The column decoder $46_j$ makes a select signal effective and supplies it to the drivers $47_{ja}$ and $47_{jb}$. The drivers $47_{ja}$ and $47_{jb}$ are respectively controlled by the clock CK1 and CK2 so as to alternately activate the ODD column line $45_{ja}$ and the EVEN column line $45_{jb}$ as shown in FIG. 3. When the driver $47_{ja}$ activates the ODD column line $45_{ja}$, the NMOSs 37 and 38 provided so as to correspond to the sense amplifier $36j$ are turned on. As a result, data on the sense amplifier $36j$ is read into the ODD data line pair 43. When the data is read into the ODD data line pair 43, a potential difference ΔV is produced between the data lines 43a and 43b of the ODD data line pair 43. The potential difference ΔV is amplified by an unillustrated read amplifier electrically connected to the ODD data line pair 43, and the amplified data is used as output data. When the EVEN column line $45_{jb}$ enters an active state, the NMOSs 39 and 40 are brought into conduction so that data on the sense amplifier $36j$ is read into the EVEN data line pair 44. When the data on the sense amplifier $36_j$ is read therein, a potential difference ΔV is produced between the EVEN data line pair 44. The potential difference ΔV is amplified by an unillustrated read amplifier electrically connected to the EVEN data line pair 44, and the amplified data is used as output data.

Thus, since the ODD data line pair 43 and the EVEN data line pair 44 are used alternately, their operating margins are ensured. Even in the cases where when an external address is input, data is read under a burst operation and the read data is transferred, and when the burst operation is discontinued to input a new external address, they are activated in the same timing. Therefore, there is no basic difference between the operating margins in two cases.

Even in the case where the write operation is performed before the read operation, as in the period between T5 and T6 in FIG. 3, the synchronous DRAM according to the present embodiment does not output error data. This reason will be described below.

During the period from T5 to T6, for example, the difference in potential between the EVEN data line pair 44 reaches a full amplitude state because of the write operation. Namely, the data lines 44a and 44b are respectively brought to a potential VCC and a potential VSS. During a read operation (corresponding to a period of T6 to T7) in the next cycle, the opposite ODD data line pair 43 is selected and the EVEN data line pair 44 is precharged. Namely, the data lines 44a and 44b are respectively precharged from the potential VSS to the potential VCC-Vt and from the potential VCC to the potential VCC-Vt. In the prior art at this time, coupling occurs due to a parasitic capacitance between the adjacent data lines and hence an initial potential applied to the data line 43b for performing the read operation was changed. In the present embodiment, however, the cross point 51 is provided at the EVEN data line pair 44. At a portion above the cross point 51, a parasitic capacitance C2 exists between the data line 43b and the data line 44b. At a portion below the cross point 51, a parasitic capacitance C3 exists between the data line 43b and the data line 44a. Couplings produced due to these parasitic capacitances C2 and C3 counteract each other at the ODD data line pair 43. In other words, the couplings canceled each other. Conversely, even when the ODD data line pair 43 is precharged and the read operation is performed by the EVEN data line pair 44, the couplings produced due to the parasitic capacitances C2 and C3 cancel each other at the EVEN data line pair 44.

Even if the information on the sense amplifier $36_i$ is thereafter read, the difference in potential between the lines of ODD data line pair 43 becomes sufficiently wide so that the proper data is outputted.

In the first embodiment as described above, the cross points 50 and 51 are respectively provided at the EVEN data line pair 42 and the EVEN data line pair 44 of the alternately-arranged ODD data line pair 41, EVEN data line pair 42, ODD data line pair 43 and EVEN data line pair 44. Therefore, the data misread due to the parasitic capacitances can be prevented from being outputted.

Figure 4:
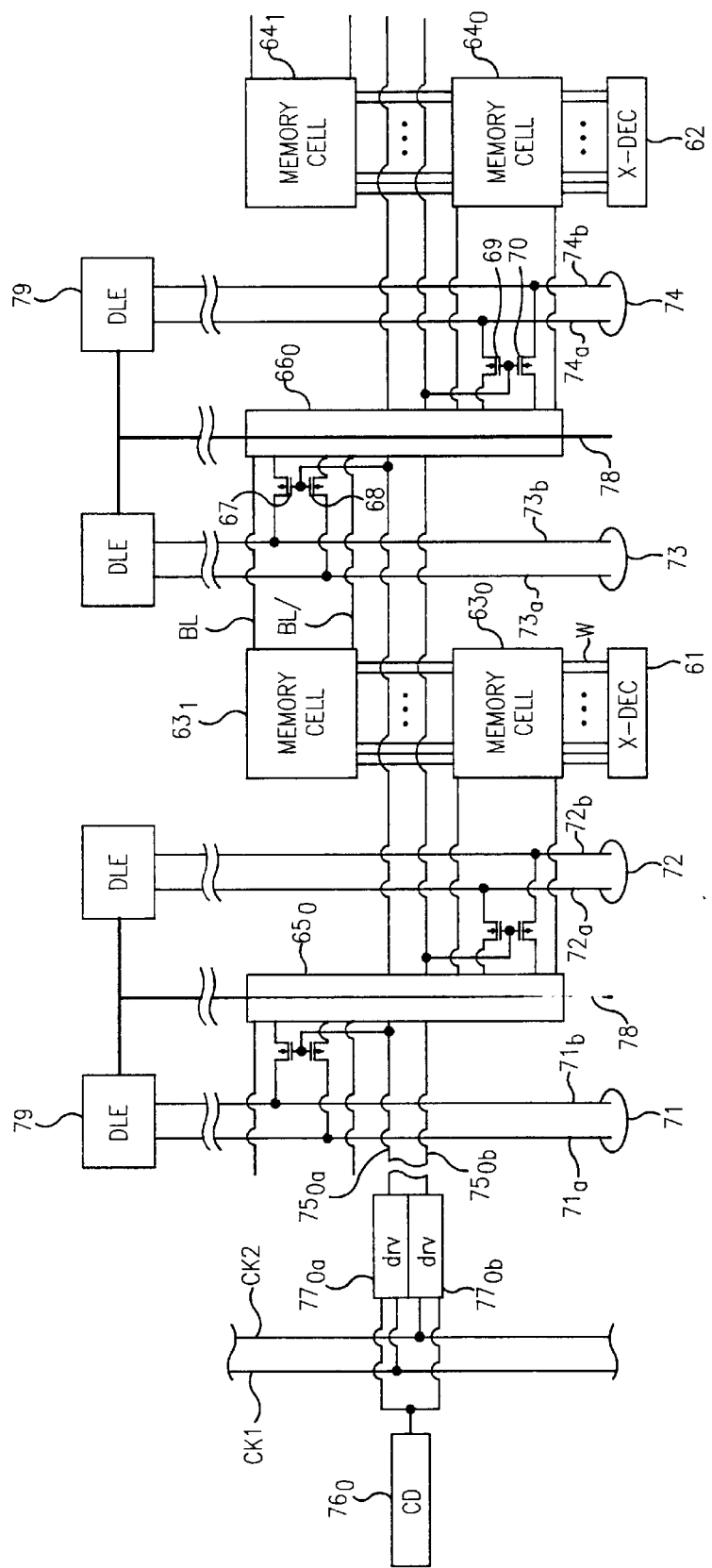
FIG. 4 is a circuit diagram of a synchronous DRAM according to a second embodiment of the present invention.

FIG. 4 is a circuit diagram of a synchronous DRAM, showing a second embodiment of the present invention.

The synchronous DRAM according to the present embodiment is also configured in the overall layout shown in FIG. 1 in a manner similar to the first embodiment and obtains access to each memory cell in block division. FIG. 4 shows a part of the synchronous DRAM, wherein two X decoders 61 and 62 are illustrated. A plurality of word lines W are respectively electrically connected to the outputs of the X decoders 61 and 62. A plurality of memory cell portions $63_0$ through $63_I$, ... are respectively electrically cascade-connected to groups of the word lines W electrically connected to the output of the X decoder 61. Similarly, a plurality of memory cell portions $64_0$ through $64_I$, ... are respectively electrically cascade-connected to groups of the word lines W electrically connected to the output of the X decoder 62. The individual memory cell portions $63_0$, $63_I$, ..., and $64_0$, $64_I$, respectively have a plurality of memory cells and constitute a memory cell array in all of these. Although the present synchronous DRAM is configured so as to have a number of memory cell portions in a manner similar to FIG. 2, they are identical in circuit configuration to each other. For simplicity, only circuit configurations around the memory cell portions $63_0$, $63_I$, $64_0$ and $64_I$ will be described below.

The plurality of memory cells included in the memory cell portion $63_0$ are electrically connected to a sense amplifier $65_0$ via two bit lines BL and BL/. The plurality of memory cells included in each of the memory cell portions $63_I$ and $64_0$ are electrically connected to a sense amplifier $66_0$ through bit lines BL and BL/. Four NMOSs 67, 68, 69 and 70 corresponding to connecting means are electrically connected to each of the sense amplifiers $65_0$ and $66_0$. In response to the turning on and off of these NMOSs 67 through 70, the sense amplifiers $65_0$ and $66_0$ are respectively electrically connected to ODD data line pairs 71 and 73 through the NMOSs 67 and 68 or respectively electrically connected to EVEN data line pairs 72 and 74 different from the ODD data line pairs 71 and 73 through the NMOSs 69 and 70. Namely, the sense amplifier $65_0$ is electrically connected to the ODD data line pair 71 or the EVEN data line pair 72, whereas the sense amplifier $66_0$ is electrically connected to the ODD data line pair 73 or the EVEN data line pair 74. The ODD data line pair 71 consists of two data lines 71a and 71b, whereas the ODD data line pair 73 is composed of two data lines 73a and 73b. Further, the EVEN data line pair 72 consists of two data lines 72a and 72b, whereas the EVEN data line pair 74 is composed of two data lines 74a and 74b. Control on the selection and connection of these sense amplifiers is done based on driven conditions or signals on an ODD column line $75_{0a}$ electrically connected to the gates of the NMOSs 67 and 68 and an EVEN column line $75_{0b}$ electrically connected to the gates of the NMOSs 69 and 70.

The synchronous DRAM shown in FIG. 4 is provided with a column decoder $76_0$. The column decoder $76_0$ is activated in synchronism with an internal clock Ci identical in frequency to an external clock Co and decodes an address supplied thereto so as to select memory cells from the memory cell array. Two drivers $77_{0a}$ and $77_{0b}$, which serve as driver means, are respectively electrically connected to the output of the column decoder $76_0$. The drivers $77_{0a}$ and $77_{0b}$ are respectively supplied with clocks CK1 and CK2 each obtained by dividing the frequency of the external clock Co into ½. However, the two clocks CK1 and CK2 are out of phase with each other by a half period. The output of the driver $77_{0a}$ is electrically connected to the ODD column line $75_{0a}$, whereas the output of the driver $77_{0b}$ is electrically connected to the EVEN column line $75_{0b}$.

The synchronous DRAM according to the present embodiment adopts a data line structure different from that employed in the first embodiment. Namely, signal lines 78 are respectively provided between the ODD data line pair 71 and the EVEN data line pair 72 and between the ODD data line pair 73 and the EVEN data line pair 74. The signal lines 78 may be provided between the EVEN data line pair 72 and the ODD data line pair 73. In this data line structure, however, memory cell portions $63_I$ are divided by the signal lines 78 and it is not preferable. The signal lines 78 are respectively supplied with data line equalize signals produced from data line equalize circuits (DLE) 79. Namely, when each data line pair is activated, the level at the signal line 78 is fixed to a power source potential.

The synchronous DRAM having such a construction also obtains access to each memory cell selected under the same operation as the first embodiment. The signal lines 78 whose levels are fixed during an access operating period, interrupt between the ODD data line pair 71 and the EVEN data line pair 72 and between the ODD data line pair 73 and the EVEN data line pair 74 so as to prevent coupling from occurring.

In the second embodiment as described above, the signal lines 78 are respectively disposed between the ODD data line pairs 71 and 73 and between the EVEN data line pairs 72 and 74. It is therefore possible to prevent the coupling between the two from occurring and avoid the output of erroneous read data.

Figure 5:
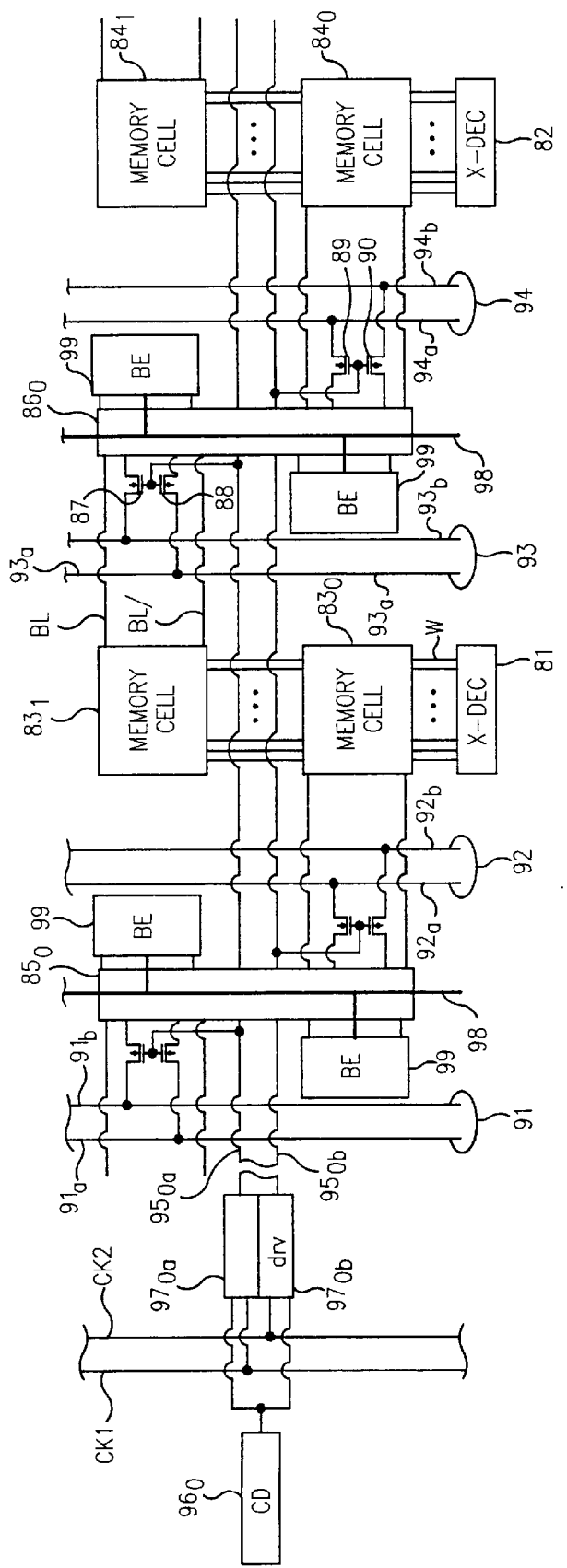
FIG. 5 is a circuit diagram of a synchronous DRAM according to a third embodiment of the present invention.

FIG. 5 is a circuit diagram of a synchronous DRAM showing a third embodiment of the present invention.

The synchronous DRAM according to the present embodiment is also configured in the entire layout shown in FIG. 1 in a manner similar to the first and second embodiments and obtains access to each memory cell in block division. FIG. 5 shows a part of the synchronous DRAM, in which two X decoders 81 and 82 are illustrated. A plurality of word lines W are respectively electrically connected to the outputs of the X decoders 81 and 82. The entire synchronous DRAM has a number of memory cell portions in a manner similar to FIG. 2. However, only a plurality of memory cell portions $83_0$, $83_I$, $84_0$ and $84_I$ and circuit configurations therearound will be described below for simplicity. The plurality of memory cell portions $83_0$ and $83_I$ are respectively electrically cascade-connected to groups of the word lines W electrically connected to the output of the X decoder 81. Similarly, the plurality of memory cell portions $84_0$ and $84_I$ are respectively electrically cascade-connected to groups of the word lines W electrically connected to the output of the X decoder 82. The individual memory cell portions $83_0$ and $83_I$, and $84_0$ and $84_I$ respectively have a plurality of memory cells and constitute a memory cell array in all of these.

The plurality of memory cells included in the memory cell portion $83_0$ are electrically connected to a sense amplifier $85_0$ via two bit lines BL and BL/. The plurality of memory cells included in each of the memory cell portions $83_I$ and $84_0$ are electrically connected to a sense amplifier $86_0$ through bit lines BL and BL/. Four NMOSs 87, 88, 89 and 90 corresponding to connecting means are electrically connected to each of the sense amplifiers $85_0$ and $86_0$. In response to the turning on and off of these NMOSs 87 through 90, the sense amplifiers $85_0$ and $86_0$ are respectively electrically connected to ODD data line pairs 91 and 93 through the NMOSs 87 and 88 of these NMOSs or respectively electrically connected to EVEN data line pairs 92 and 94 different from the ODD data line pairs 91 and 93 through the NMOSs 89 and 90 thereof. Namely, the sense amplifier $85_0$ is electrically connected to the ODD data line pair 91 or the EVEN data line pair 92, whereas the sense amplifier $86_0$ is electrically connected to the ODD data line pair 93 or the EVEN data line pair 94. The ODD data line pair 91 consists of two data liens 91a and 91b, whereas the ODD data line pair 93 is composed of two data lines 93a and 93b. Further, the EVEN data line pair 92 consists of two data lines 92a and 92b, whereas the EVEN data line pair 94 is composed of two data lines 94a and 94b. Control on the selection and connection of these sense amplifiers is performed based on driven conditions or signals on an ODD column line $95_{0a}$ electrically connected to the gates of the NMOSs 87 and 88 and an EVEN column line $95_{0b}$ electrically connected to the gates of the NMOSs 89 and 90.

The synchronous DRAM shown in FIG. 5 is provided with a column decoder $96_0$. The column decoder $96_0$ is activated in synchronism with an internal clock Ci identical in frequency to an external clock Co and decodes an address supplied thereto so as to select memory cells from the memory cell array. Two drivers $97_{0a}$ and $97_{0b}$, which serve as driver means, are respectively electrically connected to the output of each column decoder $96_0$. The drivers $97_{0a}$ and $97_{0b}$ are respectively supplied with clocks CK1 and CK2 each obtained by dividing the frequency of the external clock Co into ½. However, the two clocks CK1 and CK2 are out of phase with each other by a half period. The output of the driver $97_{0a}$ is electrically connected to the ODD column line $95_{0a}$, whereas the output of the driver $97_{0b}$ is electrically connected to the EVEN column line $95_{0b}$.

In the synchronous DRAM according to the present embodiment, power source lines 98 are respectively provided between the ODD data line pair 91 and the EVEN data line pair 92 and between the ODD data line pair 93 and the EVEN data line pair 94. The power source lines 98 may be provided between the EVEN data line pair 92 and the ODD data line pair 93. In this structure, however, memory cell portions $83_0$, $83_I$ are divided by the power source lines 98 and it is not preferable. The power source lines 98 are respectively introduced from bit line equalize circuits (BE) 99 to forcefully bring the bit lines BL and BL/ to a bit line equalize potential HVCC (HVCC≅½ VCC in the present embodiment). That is, the level at the power source lines 98 is fixed to a bit line equalize potential HVCC.

The synchronous DRAM having such a construction also obtains access to a memory cell selected under the same operation as the first embodiment The power source lines 98 whose each potential is HVCC, interrupt between the ODD data line pair 91 and the EVEN data line pair 92 and between the ODD data line pair 93 and the EVEN data line pair 94 so as to prevent coupling from occurring.

In the third embodiment as described above, the power source lines 98 are respectively disposed between the ODD data line pairs 91 and 93 and between the EVEN data line pairs 92 and 94. It is therefore possible to prevent the coupling between the two from occurring and avoid the output of erroneous read data.

Figure 6:
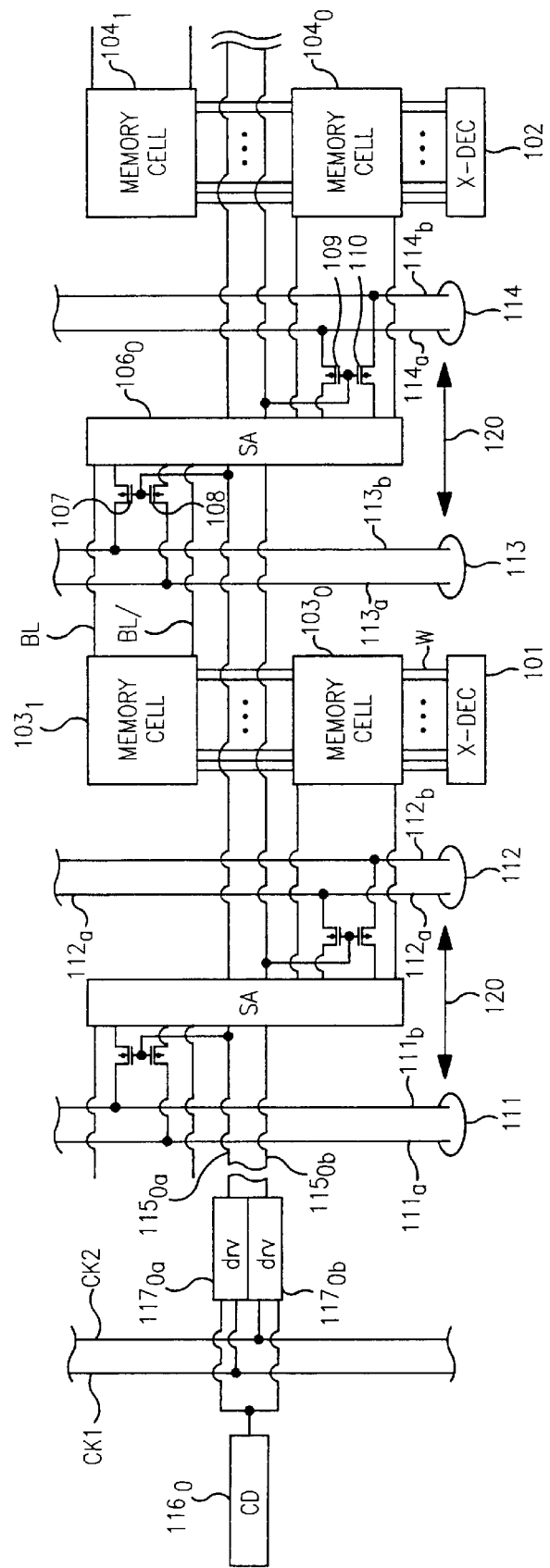
FIG. 6 is a circuit diagram of a synchronous DRAM according to a fourth embodiment of the present invention.

FIG. 6 is a circuit diagram of a synchronous DRAM showing a fourth embodiment of the present invention.

The synchronous DRAM according to the present embodiment is configured in the entire layout shown in FIG. 1 in a manner similar to the first through third embodiments and obtains access to each memory cell in block division. FIG. 6 shows a part of the synchronous DRAM, in which two X decoders 101 and 102 are illustrated. The entire synchronous DRAM has a number of memory cell portions in a manner similar to FIG. 2. However, only a plurality of memory cell portions $103_0$, $103_I$, $104_0$ and $104_I$ and circuit configurations therearound will be described below for simplicity. A plurality of word lines W are respectively electrically connected to the outputs of the X decoders 101 and 102. The plurality of memory cell portions $103_0$ and $103_I$ are respectively electrically cascade-connected to groups of the word lines W electrically connected to the output of the X decoder 101. Similarly, the plurality of memory cell portions $104_0$ and $104_I$ are respectively electrically cascade-connected to groups of the word lines W electrically connected to the output of the X decoder 102. The individual memory cell portions $103_0$, $103_1$, $104_0$ and $104_I$ respectively have a plurality of memory cells and constitute a memory cell array in all of these.

The plurality of memory cells included in the memory cell portion $103_0$ are electrically connected to a sense amplifier $105_0$ via two bit lines BL and BL/. The plurality of memory cells included in each of the memory cell portions $103_I$ and $104_0$ are electrically connected to a sense amplifier $106_0$ through bit lines BL and BL/. Four NMOSs 107, 108, 109 and 110 corresponding to connecting means are electrically connected to each of the sense amplifiers $105_0$ and $106_0$. In response to the turning on and off of these NMOSs 107 through 110, the sense amplifiers $105_O$ and $106_O$ are respectively electrically connected to ODD data line pairs 111 and 113 through the NMOSs 107 and 108 of these NMOSs or respectively electrically connected to EVEN data line pairs 112 and 114 different from the ODD data line pairs 111 and 113 through the NMOSs 109 and 110 thereof. Namely, the sense amplifier $105_O$ is electrically connected to the ODD data line pair 111 or the EVEN data line pair 112, whereas the sense amplifier $106_O$ is electrically connected to the ODD data line pair 113 or the EVEN data line pair 114. The ODD data line pair 111 consists of two data lines 111a and 111b, whereas the ODD data line pair 113 is composed of two data lines 113a and 113b. Further, the EVEN data line pair 112 consists of two data lines 112a and 112b, whereas the EVEN data line pair 114 is composed of two data lines 114a and 114b. Control on the selection and connection of these sense amplifiers is performed based on driven conditions or signals on an ODD column line $115_{Oa}$ electrically connected to the gates of the NMOSs 107 and 108 and an EVEN column line $115_{Ob}$ electrically connected to the gates of the NMOSs 109 and 110.

The synchronous DRAM shown in FIG. 6 is provided with a column decoder $116_O$. The column decoder $116_O$ is activated in synchronism with an internal clock Ci identical in frequency to an external clock Co and decodes an address supplied thereto so as to select memory cells from the memory cell array. Two drivers $117_{Oa}$ and $117_{Ob}$, which serve as driver means, are respectively electrically connected to the output of each column decoder $116_O$. The drivers $117_{Oa}$ and $117_{Ob}$ are respectively supplied with clocks CK1 and CK2 each obtained by dividing the frequency of the external clock Co into ½. However, the two clocks CK1 and CK2 are out of phase with each other by a half period. The output of the driver $117_{Oa}$ is electrically connected to the ODD column line $115_{Oa}$, whereas the output of the driver $117_{Ob}$ is electrically connected to the EVEN column line $115_{Ob}$.

In the synchronous DRAM according to the present embodiment, intervals 120 (corresponding to about 2.8 μm, for example) at which signals on the adjacent data line pairs are not degraded to an allowable value or less by their mutual interference, are respectively set between the ODD data line pair 111 and the EVEN data line pair 112 and between the ODD data line pair 113 and the EVEN data line pair 114.

The synchronous DRAM having such a construction also obtains access to a memory cell selected under the operation similar to that of each of the first through third embodiments. Since the intervals 120 reduce parasitic capacitances produced between the ODD data line pair 111 and the EVEN data line pair 112 and between the ODD data line pair 113 and the EVEN data line pair 114, the degree of coupling therebetween is reduced. Therefore, even if the EVEN data line pair 114 is precharged, for example, the initial potential of the ODD data line pair 113 for performing a read operation remains unchanged.

In the fourth embodiment as described above, since the intervals 120 for reducing the parasitic capacitances are respectively provided between the ODD data line pairs 111 and 113 and between the EVEN data line pairs 112 and 114, it is possible to avoid the output of erroneous read data due to the parasitic capacitances.

The present invention is not limited to the aforementioned embodiments and various changes can be made thereto. For example, their modifications are as follows:

Although the cross points 50 and 51 are respectively provided at the EVEN data line pairs 42 and 44 in FIG. 2, they may be provided at the ODD data line pairs 41 and 43 respectively.

Although each signal line 78 shown in FIG. 4 is provided so as to introduce the data equalize signal from the data equalize 79, it may introduce a block select signal or the like brought to a constant potential when each data line pair is active.

Further, the power source lines 98 shown in FIG. 5 are respectively fixed to the potential HVCC. However, even if the power source lines 98 are fixed to another power source potential VCC or a ground potential GND, the same effects as those obtained by the aforementioned embodiments can be brought about.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A synchronous semiconductor memory device comprising:
   a memory cell array, including a plurality of memory cells for storing data therein and a plurality of bit lines for transferring the data from the memory cells;
   a plurality of sense amplifiers coupled to the bit lines for amplifying data on the bit lines; and
   a plurality of pairs of data lines coupled to said sense amplifiers for transferring the amplified data, the data lines extending in one direction so that the data lines are substantially parallel to each other, said pairs of data lines including first pairs of data lines and second pairs of data lines located between the first pair of data lines, each of the second pairs having a cross point at which the data lines of the pair cross each other.

2. A synchronous semiconductor memory device according to claim 1, wherein the cross point is located at an intermediate portion of the data line.

3. A synchronous semiconductor memory device according to claim 1, wherein said memory cells are located at a right side of the first pairs of data lines and said sense amplifiers are located at a left side of the first pairs of data lines.

4. A synchronous semiconductor memory device according to claim 1, wherein said sense amplifiers are connected to said pairs of data lines through transfer transistors.

5. A synchronous semiconductor memory device comprising:
   a plurality of memory cells for storing data therein;
   a plurality of sense amplifiers coupled to said memory cells;
   a plurality of pairs of data lines coupled to said sense amplifiers, the data lines extending in one direction so that each of the data lines are substantially parallel to each other;
   a plurality of data line equalize circuits coupled to said pairs of data lines for generating a data line equalize signal the level of which is fixed to a power source potential when the pairs of data lines are activated; and
   a plurality of signal lines coupled to said data line equalize circuits, said signal lines extending in the one direction and located between said pairs of data lines, the data line equalize signal being provided to said signal lines.

6. A synchronous semiconductor memory device according to claim 5, wherein said pairs of data lines includes first pairs of data lines and second pairs of data lines located between the first pairs of data lines.

7. A synchronous semiconductor memory device according to claim 6, wherein said memory cells are located at a right side of the first pairs of data lines and said sense amplifiers are located at a left side of the first pairs of data lines.

8. A synchronous semiconductor memory device according to claim 6, wherein said signal lines are located at a left side of the first pairs of data lines.

9. A synchronous semiconductor memory device comprising:
 a plurality of memory cells for storing data therein;
 a plurality of bit lines for transferring data;
 a plurality of sense amplifiers coupled to said memory cells through said bit lines;
 a plurality of pairs of data lines coupled to said sense amplifiers, the data lines extending in one direction so that each of the data lines are substantially parallel to each other;
 a plurality of bit line equalize circuits coupled to said bit lines for equalizing a bit line to a bit line equalize potential; and
 a plurality of potential lines coupled to said bit line equalize circuits, said potential lines extending in the one direction and located between said pairs of data lines, said potential lines supplying the bit line equalize potential to said bit line equalize circuits.

10. A synchronous semiconductor memory device according to claim 9, wherein said pairs of data lines include first pairs of data lines and second pairs of data lines located between the first pairs of data lines.

11. A synchronous semiconductor memory device according to claim 11, wherein said memory cells are located at a right side of the first pairs of data lines and said sense amplifiers are located at a left side of the first pairs of data lines.

12. A synchronous semiconductor memory device according to claim 10, wherein said potential lines are located at a left side of the first pairs of data lines.

13. A synchronous semiconductor memory device according to claim 9, wherein said bit line equalize potential is a half of a power supply potential of the memory, device.

14. A synchronous semiconductor memory device comprising:
 a plurality of pairs of data lines extending in one direction so that the data lines are substantially parallel to each other, said pairs of data lines including first pairs of data lines and second pairs of data lines located between the first pairs of data lines;
 a plurality of memory cells for storing data therein, said memory cells being located at a right side of the first pairs of data lines and at a left side of the second pairs of data lines; and
 a plurality of sense amplifiers coupled to said memory cells and said pairs of data lines, said sense amplifiers being located at a right side of the second pairs of data lines and at a left side of the first pairs of data lines; and
 intervals between the first pairs of data lines and the second pairs of data lines having a predetermined physical length so that signals on the adjacent pair of data lines are not degraded to an allowable value or less by their mutual interference.

15. A synchronous semiconductor memory device according to claim 14, wherein each of said intervals is about 2.8 $\mu$m.

16. A synchronous semiconductor memory device according to claim 15, wherein said sense amplifiers are connected to said pairs of data lines through transfer transistors.

17. A synchronous semiconductor memory device according to claim 1, wherein the first pairs of data lines transfer data when the second pairs of data lines are precharged, and the second pairs of data lines transfer data when the first pairs of data lines are precharged.

18. A synchronous semiconductor memory device according to claim 17,
 wherein said pairs of data lines are precharged to a precharge level equal to a power source potential minus a threshold voltage of a transfer transistor, before a read operation is started, and
 wherein during a write operation, one bit line of each of said pairs of bit lines is supplied with the power source potential and the other bit line of said each of said pairs of bit lines is supplied with a ground potential.

19. A synchronous semiconductor memory device according to claim 5, wherein the first pairs of data lines transfer data when the second pairs of data lines are precharged, and the second pairs of data lines transfer data when the first pairs of data lines are precharged.

20. A synchronous semiconductor memory device according to claim 19,
 wherein said pairs of data lines are precharged to the power source potential minus the threshold voltage of a transfer transistor, before a read operation is started, and
 wherein one bit line of said pairs of bit lines is supplied with the power source potential and the other bit line of said pairs of bit lines is supplied with a ground potential, during a write operation.

21. A synchronous semiconductor memory device according to claim 8,
 wherein the first pairs of data lines transfer data when the second pairs of data lines are precharged, and the second pairs of data lines transfers data when the first pairs of data lines are precharged.

22. A synchronous semiconductor memory device according to claim 21,
 wherein said pairs of data lines are precharged to a value equal to the power source potential minus the threshold voltage of a transfer transistor, before a read operation is started, and
 wherein during a write operation, one bit line of each of said pairs of bit lines is supplied with the power source potential and the other bit line of said each of said pairs of bit lines is supplied with a ground potential.

23. A synchronous semiconductor memory device according to claim 13,
 wherein the first pairs of data lines transfer data when the second pairs of data lines are precharged, and the second pairs of data lines transfers data when the first pairs of data lines are precharged.

24. A synchronous semiconductor memory device according to claim 23,
 wherein said pairs of data lines are precharged to a value equal to a power source potential minus a threshold voltage of a transfer transistor, before a read operation is started, and
 wherein one bit line of each of said pairs of bit lines is supplied with the power source potential and the other bit line of said each of said pairs of bit lines is supplied with a ground potential, during a write operation.

* * * * *